United States Patent [19]
Boyce

[11] Patent Number: 4,843,469
[45] Date of Patent: Jun. 27, 1989

[54] RAPID SIGNAL ACQUISITION AND PHASE AVERAGED HORIZONTAL TIMING FROM COMPOSITE SYNC

[75] Inventor: Rory W. Boyce, Fair Oaks, Calif.
[73] Assignee: The Grass Valley Group, Inc., Grass Valley, Calif.
[21] Appl. No.: 37,365
[22] Filed: Apr. 13, 1987
[51] Int. Cl.$^4$ .............................................. H04N 5/04
[52] U.S. Cl. .................................. 358/148; 358/149
[58] Field of Search ............... 358/148, 149, 150, 151, 358/152, 153, 154, 155, 158; 375/106, 108, 111, 118, 119, 120; 331/1 R, 18, 20, 25

[56] References Cited
U.S. PATENT DOCUMENTS
4,092,672  5/1978  Aschwanden ..................... 358/149

Primary Examiner—Howard W. Britton
Assistant Examiner—Michael D. Parker
Attorney, Agent, or Firm—Francis I. Gray

[57] ABSTRACT

A circuit for extracting phase averaged horizontal timing with high noise immunity and for rapidly acquiring a video signal from a composite synchronizing signal generates an output signal at the horizontal sync rate, the output signal having leading edges occurring at the leading edges of the horizontal sync pulses of the composite synchronizing signal. The rate of the output signal is phase averaged by comparing the respective leading edges of the output signal and the composite synchronizing signal within a window centered about the leading edges of the output signal. Difference in the phases of the respective leading edges result in an error signal which is used to adjust the rate of the output signal to obtain coincidence of the respective leading edges. The occurrence of the leading edges of the composite synchronizing signal within the window is used to lock the circuit. Failure of the leading edges of the composite synchronizing signal to occur within the window due to a change in video source results in unlocking the circuit and resetting the output signal to a new composite synchronizing signal.

7 Claims, 2 Drawing Sheets

RAPID SIGNAL ACQUISITION AND PHASE AVERAGED HORIZONTAL TIMING FROM COMPOSITE SYNC

BACKGROUND OF THE INVENTION

The present invention relates to television timing circuits, and more particularly to a circuit for extracting phase averaged horizontal timing with high noise immunity and rapid signal acquisition from a composite synchronizing signal.

The most critical design in every television production facility is the system timing. There are many sources of video signals in a production facility, such as video camera and video tape recorders, which all must be synchronized so that they may be combined without resulting in the picture on a receiver or monitor rolling, pumping, tearing or having incorrect colors. The necessary timing reference is provided by a sync generator.

The sync generator receives a reference video signal from one video source and generates reference sync signals for the other video sources in the production facility. At the heart of the sync generator is a genlock circuit which locks an internal oscillator loop to the composite sync of the reference video signal. If the reference video source is changed, the new reference video signal may have a composite sync which is either advanced or delayed with respect to the prior reference video signal. Therefore, rapid acquisition of the new signal is required so that the genlock circuit locks to the new reference video signal. However, if the reference video signal is noisy, resulting in jitter of the composite sync, or even loss of some of the sync pulses, it is desirable to maintain genlock on the reference video signal by phase averaging the horizontal sync pulses of the composite sync. These requirements, rapid acquisition and phase averaging, are contradictory. For rapid acquisition it is desirable to lock to the new reference video signal within one horizontal line period, while phase averaging requires waiting for many horizontal lines to assure that the reference video signal has in fact changed rather than been disguised by noise.

What is desired is a sync generator which both time averages the horizontal sync over long periods and locks to new reference video signal phases rapidly.

SUMMARY OF THE INVENTION

Accordingly the present invention provides a circuit for extracting phase averaged horizontal timing with high noise immunity and rapid signal acquisition from a composite synchronizing signal. A voltage controlled oscillator provides a clock which is divided down to the horizontal frequency rate by a counter. The counter's output is phase compared with the leading edges of incoming composite synchronizing pulses. Any phase error is amplified and used to control the oscillator's frequency to keep the two in phase. A logic circuit driven from the counter provides a window pulse centered about the pulse edge from the counter being phase compared, and inhibits the phase detector except during the window time. The window pulse is also compared with the incoming pulse leading edges by a lock detector and, if the edges are not within the window, an unlock condition is detected. A reset generator resets the counter when unlock is detected from the leading edge of the next incoming sync pulse, setting the phase of the counter's output to coincide with the incoming sync pulses.

The objects, advantages and novel features of the present invention will be apparent from the following detailed description when read in conjunction with the appended claims and attached drawing.

DESCRIPTION OF THE PREFERRED EMBODIMENT

Figure 1:
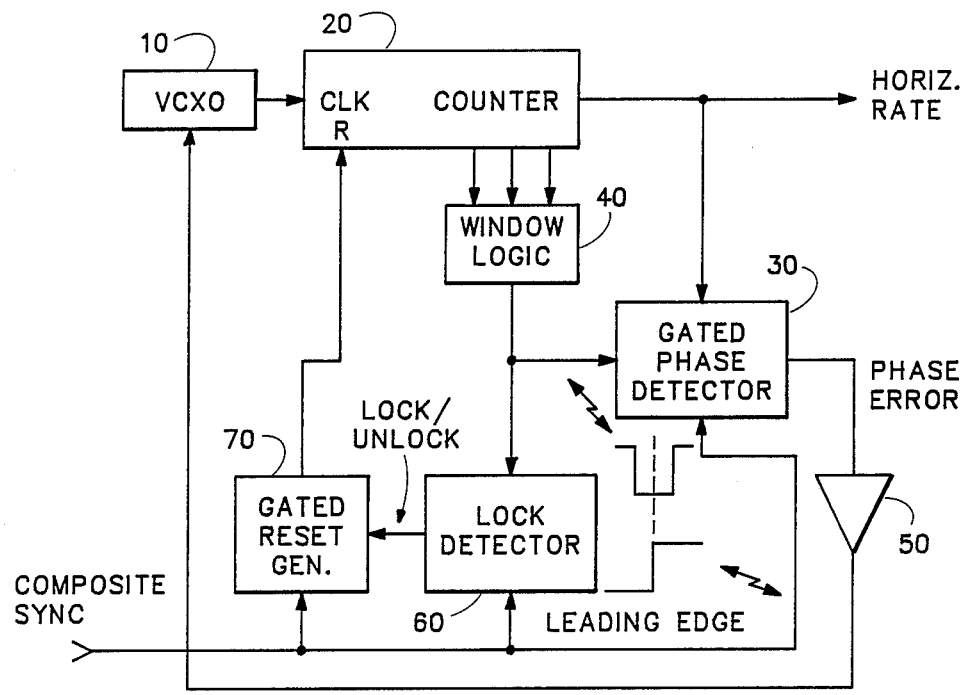
FIG. 1 is a block diagram of a circuit according to the present invention.
Figure 2:
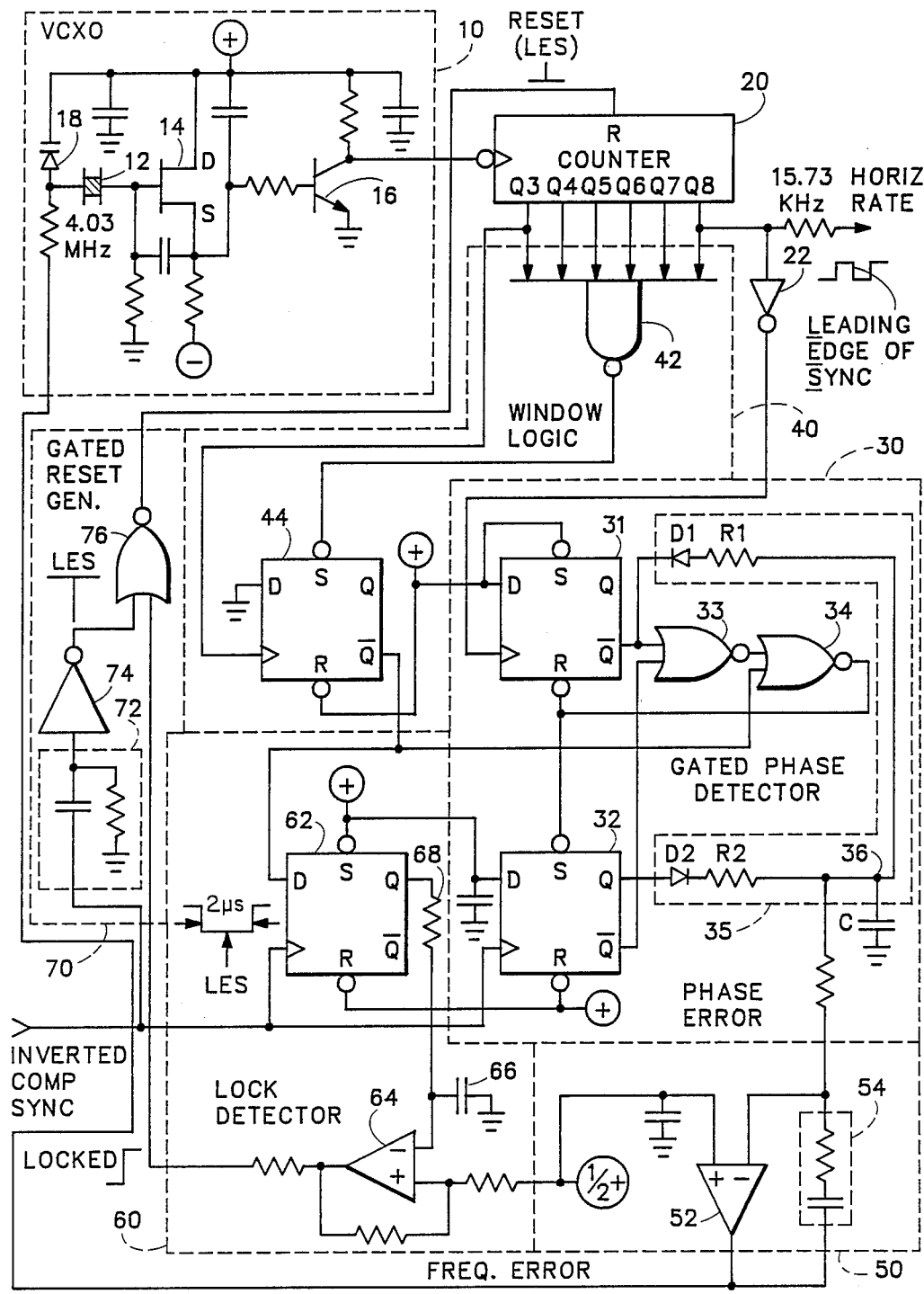
FIG. 2 is a schematic diagram for the circuit of FIG. 1.

Referring now to FIGS. 1 and 2 a frequency controllable oscillator 10, such as a voltage controlled crystal oscillator (VCXO), provides a high frequency output to a counter 20. The counter 20 divides the high frequency output from the VCXO 10 to generate an output signal at a horizontal sync rate. A transition of the output signal from the counter 20, such as from high to low, corresponds to the leading edge of horizontal sync. This transition is input to a gated phase detector 30. Also input to the gated phase detector 30 is a window pulse generated by a window logic circuit 40 from the counter 20. The transition of the horizontal output signal from the counter 20 is compared with the leading edge of sync from the composite sync input within the window pulse period. Any detected phase error is output as a PHASE ERROR signal from the gated phase detector 30, amplified and filtered by an amplifier 50, and input to the VCXO 10 to control the oscillator frequency.

The window pulse from the window logic circuit 40 also is used to gate a lock detector 60. The composite sync is input to the lock detector 60 which produces a LOCK or UNLOCK output signal depending upon whether the composite sync leading edges are generally within or outside the window defined by the window pulse. The LOCK/UNLOCK signal from the lock detector 60 is input to a gated reset generator circuit 70 together with the composite sync signal. The gated reset generator circuit 70 outputs a reset signal to the counter 20 upon receipt of the leading edge of sync if enabled by the UNLOCK signal.

The VCXO 10 is a conventional circuit having a crystal 12 which with an FET transistor 14 nominally oscillates at an integer power of two multiple of the horizontal sync rate. The output of the FET transistor 14 is converted into a square wave signal by an output transistor 16. A varactor diode 18 in the oscillator circuit provides voltage control of the oscillator frequency. The counter 20 increments for each negative going edge of the output square wave from the VCXO 10. When the counter 20 reaches its maximum count, the next negative edge from the VCXO 10 causes the most significant bit, Q8, to transition to a low level, indicating the leading edge (LES) for a horizontal sync pulse. The output of the counter 20 from Q8 is a square wave at the horizontal sync rate. This horizontal rate output is inverted by inverter 22 and input to the gated phase detector.

The most significant bits (Q3–Q8) from the counter 20 are input to a NAND gate 42 which provides a low level signal to the set input of a window flip-flop 44 just prior to the occurrence of LES. At the same time the least significant bit Q3 input to the NAND gate 42 is input to the clock input of the window flip-flop 44. The D input of the window flip-flop is held at a low level and the reset input is held disabled. With outputs Q3–Q8 from the counter 20 at a high level, the /Q output of the window flip-flop 44 goes low. When the Q3 output from the counter 20 cycles to provide another clock input pulse to the window flip-flop 44, the set input is disabled and the low level at D is stored, causing the /Q output to return to a high level. The result is a negative window pulse nominally centered about LES.

The gated phase detector 30 has a first phase flip-flop 31 which is clocked by the inverted horizontal rate output signal from the counter 20. The set input of the first phase flip-flop 31 is disabled and the D input is held at a high level. For each LES from the horizontal rate output signal the high level is stored in the first phase flip-flop 31, the /Q output transitioning to a low level. Likewise a second phase flip-flop 32 is configured in the same manner as the first phase flip-flop 31 except that the clock input is tied to the LES from an inverted composite sync signal. The /Q outputs from the phase flip-flops 31, 32 are input to a first NOR gate 33. The output of the first NOR gate 33 and the window pulse from the window logic circuit 40 are input to a second NOR gate 34. The output of the second NOR gate 34 is tied to the reset inputs of the phase flip-flops 31, 32 to reset the flip-flops after both LES clock inputs have been received within the window defined by the window pulse. A voltage divider network 35 of diodes D1, D2, resistors R1, R2 is connected between the /Q output of the first phase flip-flop 31 and the Q output of the second phase flip-flop 32. A capacitor C, which acts as an integrator, is connected at the midpoint 36 between the resistors R1, R2 and ground. The nominal value at the midpoint 36 is the average of the high and low level. If the two LES clock signals occur simultaneously, both the /Q output of the first phase flip-flop 31 and the Q output of the second phase flip-flop 32 change level at the same time, resulting in no net change of the nominal level at the midpoint 36. If the LES clock input from the counter 20 occurs first, then the /Q output of the first flip-flop 31 and the Q output of the second flip-flop 32 are at a low level simultaneously, resulting in discharging of the capacitor C. Likewise if the LES clock input from the composite sync signal occurs first, then the /Q output of the first phase flip-flop 31 and the Q output of the second phase flip-flop 32 are at a high level simultaneously, resulting in charging of the capacitor C. The PHASE ERROR signal from the gated phase detector 30 is taken from the midpoint 36.

The PHASE ERROR signal from the gated phase detector 30 is input to the inverting input of an operational amplifier 52 wherein it compared with a nominal, no phase error voltage. The PHASE ERROR signal is filtered by a feedback filter 54 connected between the output and inverting input of the operational amplifier 52. The resulting frequency error signal from the operational amplifier 52 is applied to the VCXO 10 to adjust the nominal frequency of the oscillator circuit. The frequency error signal varies about a zero level.

The window pulse is also applied to the D input of a lock flip-flop 62 which has its set and reset inputs disabled. The lock flip-flop 62 operates as a D-type flip-flop and is clocked by the LES from the composite sync signal. When the LES occurs within the window defined by the window pulse, the Q output of the lock flip-flop 62 transitions to a low level. The Q output of the lock flip-flop 62 is averaged by resistor 68 and capacitor 66 and input to the inverting input of a lock comparator 64, the non-inverting input of which is tied to a nominal average value between the high and low levels. The output of the lock comparator 64 is high so long as the LES from the composite sync signal most often occurs within the window of the window pulse, indicating a LOCK condition. If the LES occurs most often outside the window, the output of the lock comparator 64 transitions to a low level, indicative of an UNLOCK condition.

The LOCK/UNLOCK signal from the lock detector 60 is input to a reset NOR gate 76, disabling the reset NOR gate during LOCK condition and enabling it during UNLOCK condition. The inverted composite sync signal is input to a differentiating circuit 72, converting the LES to a sharp spike. The differentiated LES is inverted by a reset inverter 74, and the resulting output of the reset inverter is input to the reset NOR gate 76. If the reset NOR gate 76 is enabled by the UNLOCK condition, the output of the reset NOR gate 76 is a RESET pulse which is applied to the reset input of the counter 20.

In operation the circuit is initially UNLOCKED so that the first LES from the composite sync signal resets the counter 20. The counter 20 proceeds to count the clock pulses from the VCXO 10 and opens the window just prior to the generation of the LES from the counter. The window is closed by the window logic circuit just after the generation of the LES from the counter 20. The next LES from the composite sync signal is compared with the LES from the counter 20 in the gated phase detector 30 so long as both occur within the window. Any phase error is amplified and filtered to provide a frequency error signal to adjust the frequency of the VCXO 10. The LES from the composite sync signal also is checked by the lock detector 60 to assure that it occurs within the window, resulting in a LOCK condition which inhibits the gated reset generator 70 from resetting the counter 20. The window allows for jitter of the horizontal sync signal within a limited range, such as plus/minus the microsecond about nominal. If a sync pulse is missing due to noise, the counter 20 continues to count the VCXO clock pulses to generate a window at the next anticipated horizontal interval without losing LOCK. If the composite sync signal source is changed, the LES from the composite sync signal will not occur within the window so that an UNLOCK condition will be indicated. The LES will then be passed through the gated reset generator 70 to reset the counter 20 so that acquisition occurs on the LES of the changed composite sync signal.

Thus the present invention provides a circuit for rapidly acquiring a new video signal source while extracting phase averaged horizontal timing with high noise immunity by generating a window about the leading edge of the sync pulses. The window is used to control a phase detect circuit to generate a frequency error signal for a voltage controlled crystal oscillator and to generate a lock to horizontal sync signal which enables the circuit to phase average the horizontal timing as well as lock rapidly onto a new signal source.

What is claimed is:
1. A circuit for locking to an input video signal from a source, the input video signal having a composite sync component, comprising:
means for generating an output signal at a rate corresponding to the sync rate of the composite sync component;

means for phase averaging the output signal with respect to the composite sync component to adjust for variations in the sync rate of the composite sync component; and means for rapidly locking to the composite sync component of a new input video signal having a phase difference greater than a predetermined value from the output signal when the source of the input video signal changes.

2. A circuit as recited in claim 1 wherein the generating means comprises:

an oscillator generating a first frequency signal; and means for dividing the first frequency signal to produce the output signal.

3. A circuit as recited in claim 2 wherein the dividing means comprises a counter which increments for each cycle of the first frequency signal, the counter automatically resetting at the rate of the output signal.

4. A circuit as recited in claim 1 wherein the phase averaging means comprises:

means for comparing leading edges of the output signal with leading edges of the composite sync component to generate an error signal representative of the time difference between the respective leading edges; and means for applying the error signal to the generating means to adjust the rate of the output signal to bring the respective leading edges into coincidence.

5. A circuit as recited in claim 4 wherein the comparing means comprises:

means for defining a window centered on the leading edges of the output signal;

means for generating a first voltage level when the leading edges of the output signal occur prior to the leading edges of the composite sync component within the window;

means for generating a second voltage level when the leading edges of the composite sync component occur prior to the leading edges of the output signal within the window; and means for combining the first and second voltage levels with a nominal voltage level to generate the error signal.

6. A circuit as recited in claim 4 wherein the applying means comprises means for converting the error signal into a voltage level, the voltage level being input to the generating means to adjust the rate of the output signal as a function of the voltage level.

7. A circuit as recited in claim 1 wherein the acquiring means comprises:

means for defining a window centered on the leading edges of the output signal;

means for detecting when the leading edges of the composite sync component occur within the window; and means for restarting the generating means when the leading edges of the composite sync component occur outside the window.

* * * * *